(12) United States Patent
Laidig et al.

(10) Patent No.: US 10,495,975 B2
(45) Date of Patent: *Dec. 3, 2019

(54) LINE EDGE ROUGHNESS REDUCTION VIA STEP SIZE ALTERATION

(71) Applicant: Applied Materials, Inc., Santa Clara, CA (US)

(72) Inventors: Thomas L. Laidig, Richmond, CA (US); Joseph R. Johnson, Redwood City, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/389,412

(22) Filed: Apr. 19, 2019

(65) Prior Publication Data

US 2019/0243250 A1    Aug. 8, 2019

Related U.S. Application Data

(63) Continuation of application No. 15/253,379, filed on Aug. 31, 2016, now Pat. No. 10,289,003.

(60) Provisional application No. 62/214,793, filed on Sep. 4, 2015.

(51) Int. Cl.
*G03F 7/20* (2006.01)

(52) U.S. Cl.
CPC .................. *G03F 7/2051* (2013.01)

(58) Field of Classification Search
CPC .................................................... G03F 7/2051
See application file for complete search history.

(56) References Cited

U.S. PATENT DOCUMENTS

| 8,184,265 B2 | 5/2012 | Wardenier |
| 10,289,003 B2 | 5/2019 | Laidig et al. |
| 2013/0050778 A1 | 2/2013 | Stowe et al. |
| 2013/0050803 A1 | 2/2013 | Stowe et al. |

FOREIGN PATENT DOCUMENTS

| CN | 103048885 A | 4/2013 |
| WO | 03046665 A1 | 6/2003 |

OTHER PUBLICATIONS

International Search Report and Written Opinion from PCT/US2016/045959 dated Dec. 5, 2016.

*Primary Examiner* — Deoram Persaud
(74) *Attorney, Agent, or Firm* — Patterson + Sheridan, LLP (57) ABSTRACT

An image correction application relating to the ability to apply maskless lithography patterns to a substrate in a manufacturing process is disclosed. The embodiments described herein relate to a software application platform, which corrects non-uniform image patterns on a substrate. The application platform method includes in a digital micromirror device (DMD) installed in an image projection system, the DMD having a plurality of columns, each column having a plurality of mirrors, disabling at least one entire column of the plurality of columns, exposing a first portion of the substrate to a first shot of electromagnetic radiation, exposing a second portion of the substrate to a second shot of electromagnetic radiation, and iteratively translating the substrate a step size and exposing another portion of the substrate to another shot of electromagnetic radiation until the substrate has been completely exposed to shots of electromagnetic radiation.

20 Claims, 11 Drawing Sheets

LINE EDGE ROUGHNESS REDUCTION VIA STEP SIZE ALTERATION

CROSS-REFERENCE TO RELATED APPLICATIONS

This application is a continuation of U.S. application Ser. No. 15/253,379, filed Aug. 31, 2016, which claims benefit of U.S. Provisional Appl. No. 62/214,793, filed Sep. 4, 2015, which are hereby incorporated by reference in their entirety.

BACKGROUND

Field

Embodiments of the present disclosure generally relate to the field of maskless lithography. More specifically, embodiments provided herein relate to a system and method for performing maskless digital lithography manufacturing processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

As the foregoing illustrates, there is a need for an improved technique for correcting non-uniform patterns. More specifically, what is needed in the art is an application that manipulates columns of mirrors in the pattern generator to reduce line edge roughness.

SUMMARY

An image correction application relating to the ability to apply maskless lithography patterns to a substrate in a manufacturing process is disclosed. The embodiments described herein relate to a software application platform, which corrects non-uniform image patterns on a substrate.

In one embodiment, a method for correcting non-uniform image patterns on a substrate is disclosed. The method may include in a digital micromirror device (DMD) installed in an image projection system, the DMD having a plurality of columns, each column having a plurality of mirrors, disabling at least one entire column of the plurality of columns, exposing a first portion of the substrate to a first shot of electromagnetic radiation, translating the substrate a step size and exposing a second portion of the substrate to a second shot of electromagnetic radiation, and iteratively translating the substrate a step size and exposing another portion of the substrate to another shot of electromagnetic radiation until the substrate has been completely exposed to shots of electromagnetic radiation.

In another embodiment, a computer system for correcting non-uniform image patterns on a substrate is disclosed. The computer system may include a processor and a memory storing instructions that, when executed by the processor, cause the computer system to, in a DMD installed in an image projection system, the DMD having a plurality of columns, each column having a plurality of mirrors, disable at least one entire column of the plurality of columns, expose a first portion of the substrate to a first shot of electromagnetic radiation, translate the substrate a step size and expose a second portion of the substrate to a second shot of electromagnetic radiation, and iteratively translate the substrate a step size and expose another portion of the substrate to another shot of electromagnetic radiation until the substrate has been completely exposed to shots of electromagnetic radiation.

In yet another embodiment, a non-transitory computer-readable storage medium, storing instructions that, when executed by a processor, cause a computer system to correct non-uniform image patterns on a substrate is disclosed. The processor may perform the steps of in a DMD installed in an image projection system, the DMD having a plurality of columns, each column having a plurality of mirrors, disabling at least one entire column of the plurality of columns, exposing a first portion of the substrate to a first shot of electromagnetic radiation, translating the substrate a step size and exposing a second portion of the substrate to a second shot of electromagnetic radiation, and iteratively translating the substrate a step size and exposing another portion of the substrate to another shot of electromagnetic radiation until the substrate has been completely exposed to shots of electromagnetic radiation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to a software application relating to the ability to apply maskless lithography patterns to a substrate in a manufacturing process is disclosed. The software application includes disabling at least one entire column of mirrors in a digital micromirror device (DMD) installed in an image projection system, wherein the DMD has a plurality of columns, each column having a plurality of mirrors, exposing a first portion of the substrate to a first shot of electromagnetic radiation, exposing a second portion of the substrate to a second shot of electromagnetic radiation, and repeating exposing a second portion of the substrate to a second shot until the substrate is fully processed.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1:
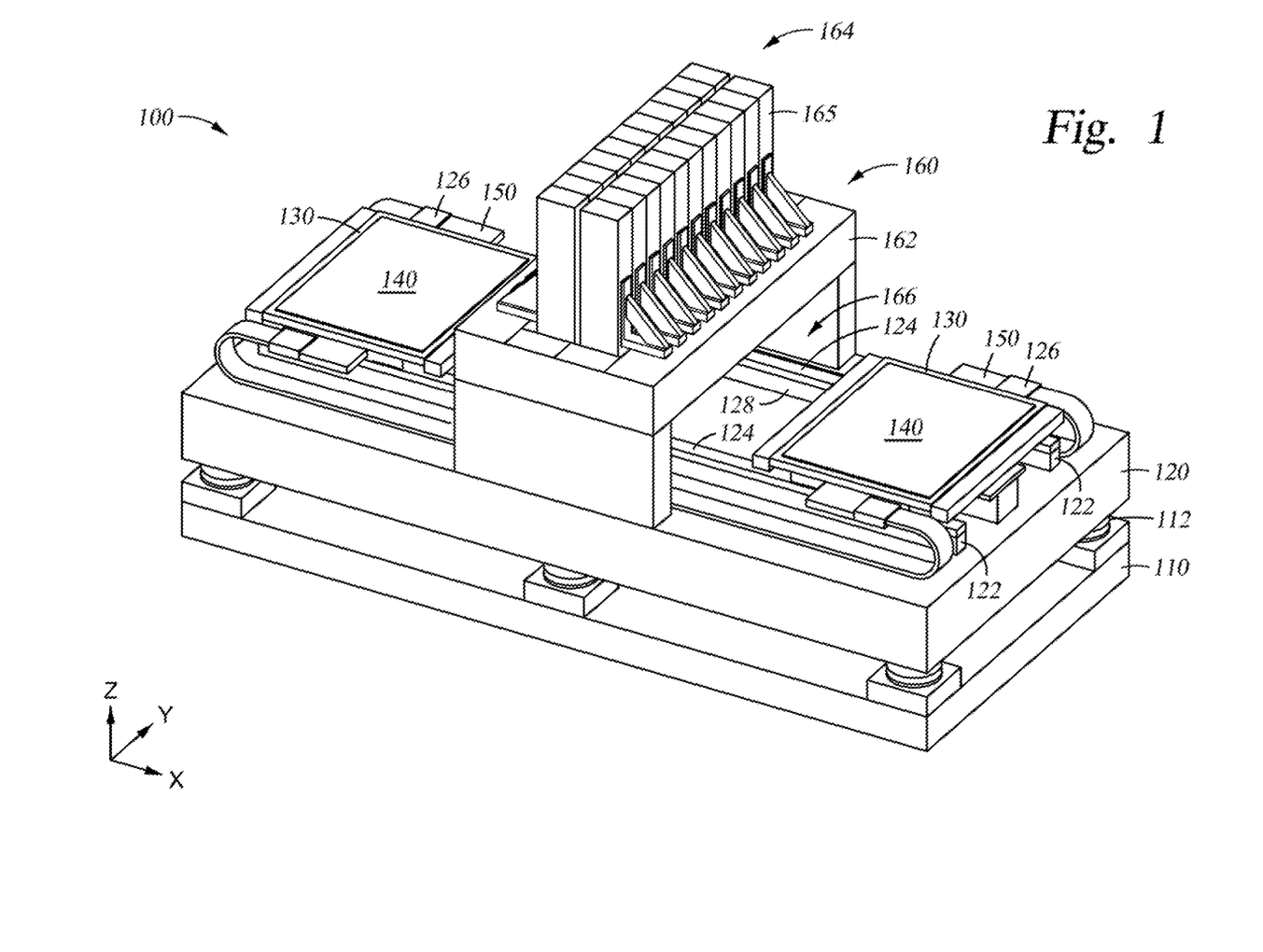
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials such as glass. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 602 (See FIG. 8).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings 202 (shown in FIG. 2) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140.

Figure 2:
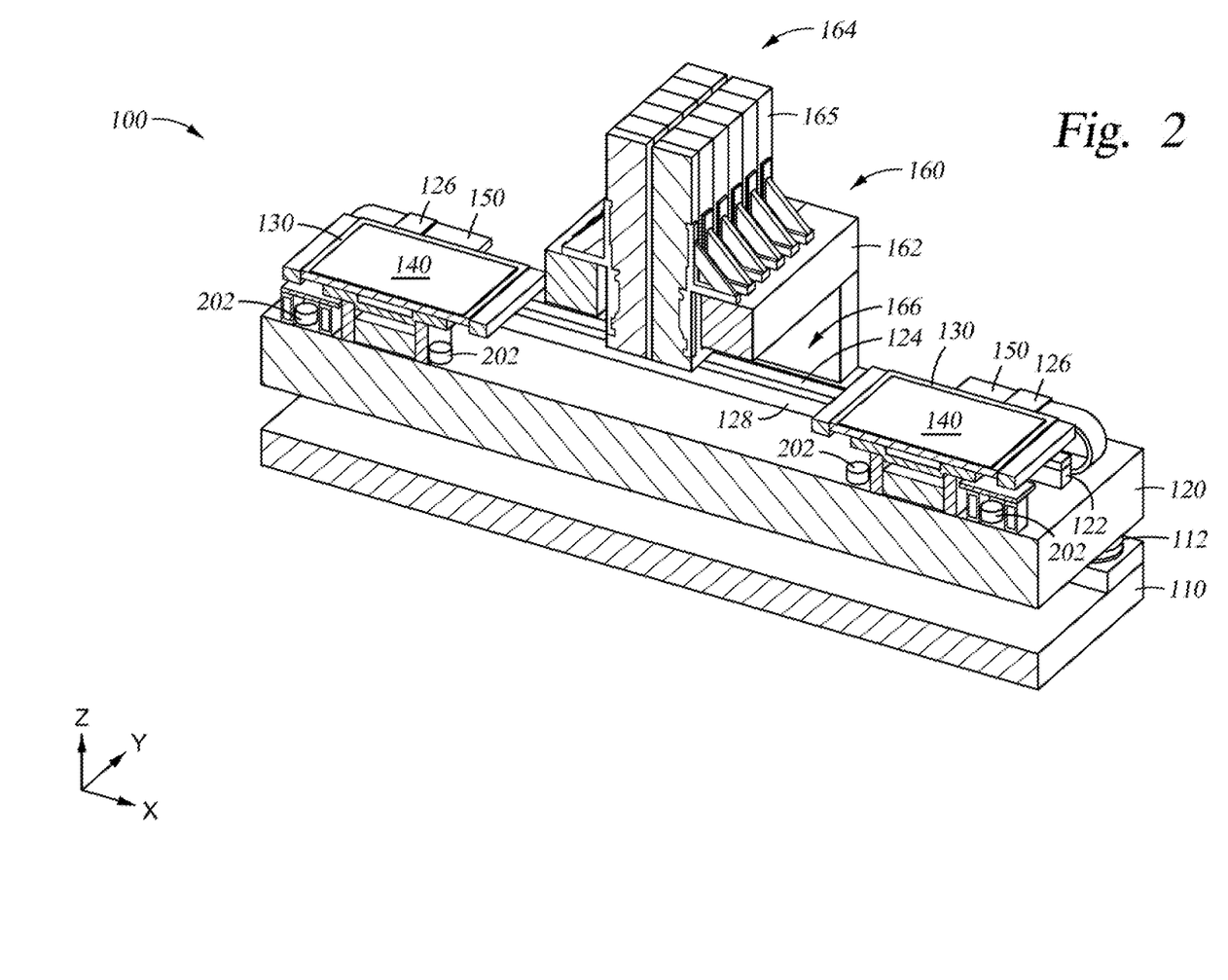
FIG. 2 is a cross-sectional side view of the system of FIG. 1 according to one embodiment.

FIG. 2 is a cross-sectional side view of the system 100 of FIG. 1 according to one embodiment. As shown, each stage 130 includes a plurality of air bearings 202 for lifting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 3:
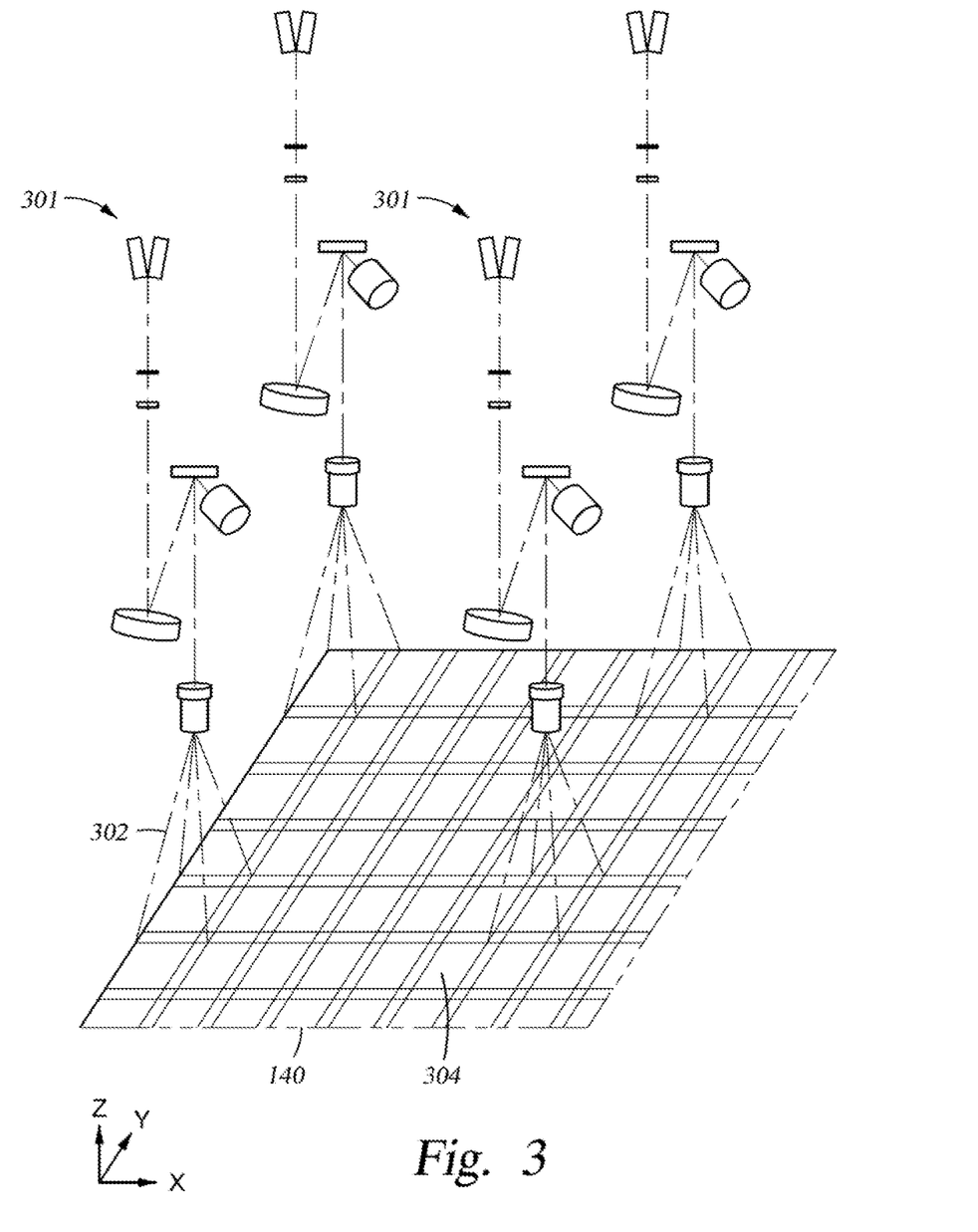
FIG. 3 is a perspective schematic view of a plurality of image projection systems according to one embodiment.

FIG. 3 is a perspective schematic view of a plurality of image projection systems 301 according to one embodiment. As shown in FIG. 3, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 164 in the processing apparatus 160.

Figure 4:
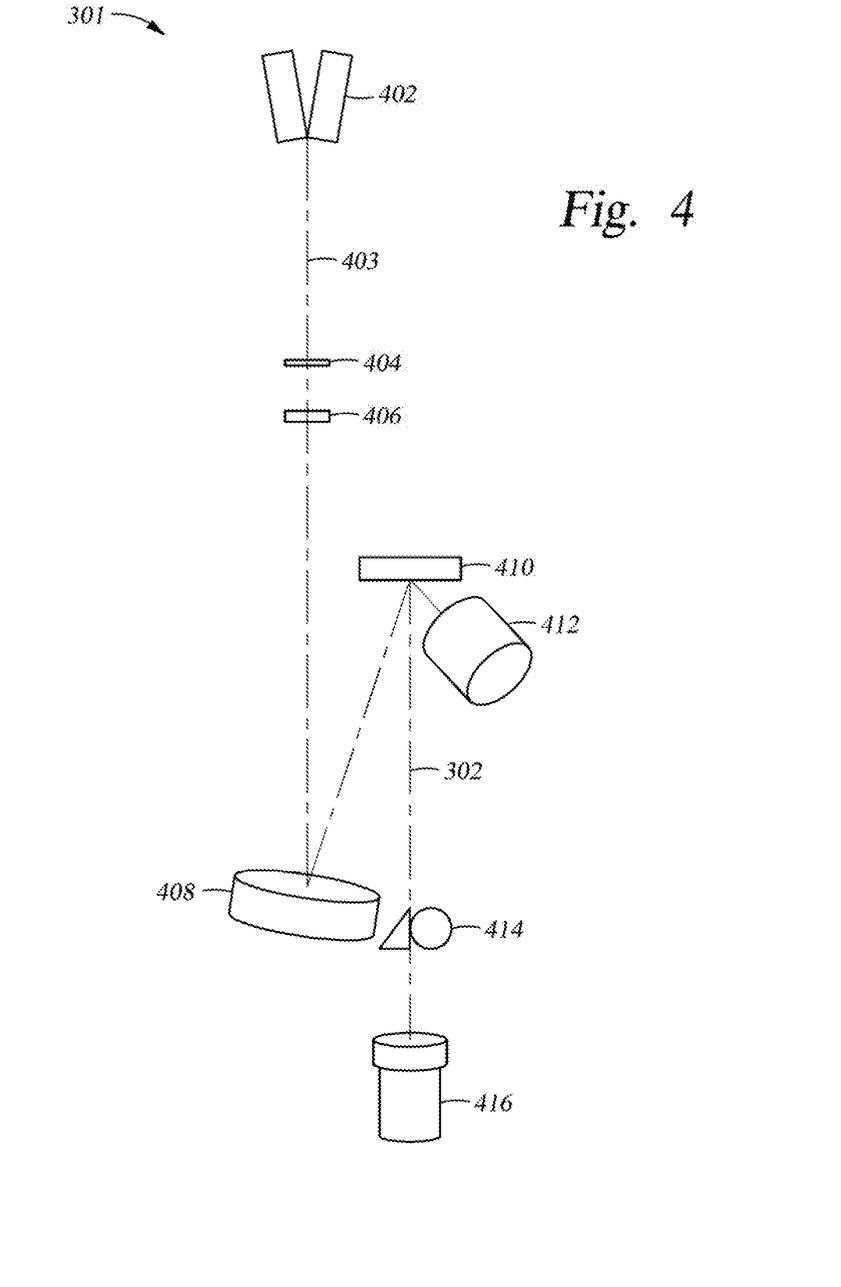
FIG. 4 is a perspective schematic view of an image projection system of the plurality of image projection devices of FIG. 3 according to one embodiment.

FIG. 4 is a perspective schematic view of one image projection system 301 of the plurality of image projection systems 301 of FIG. 3 according to one embodiment. The image projection system 301 may include a light source 402, an aperture 404, a lens 406, a mirror 408, a digital micromirror device (DMD) 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors, which represent the number of pixels of a high definition television or other flat panel displays.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

Figure 5:
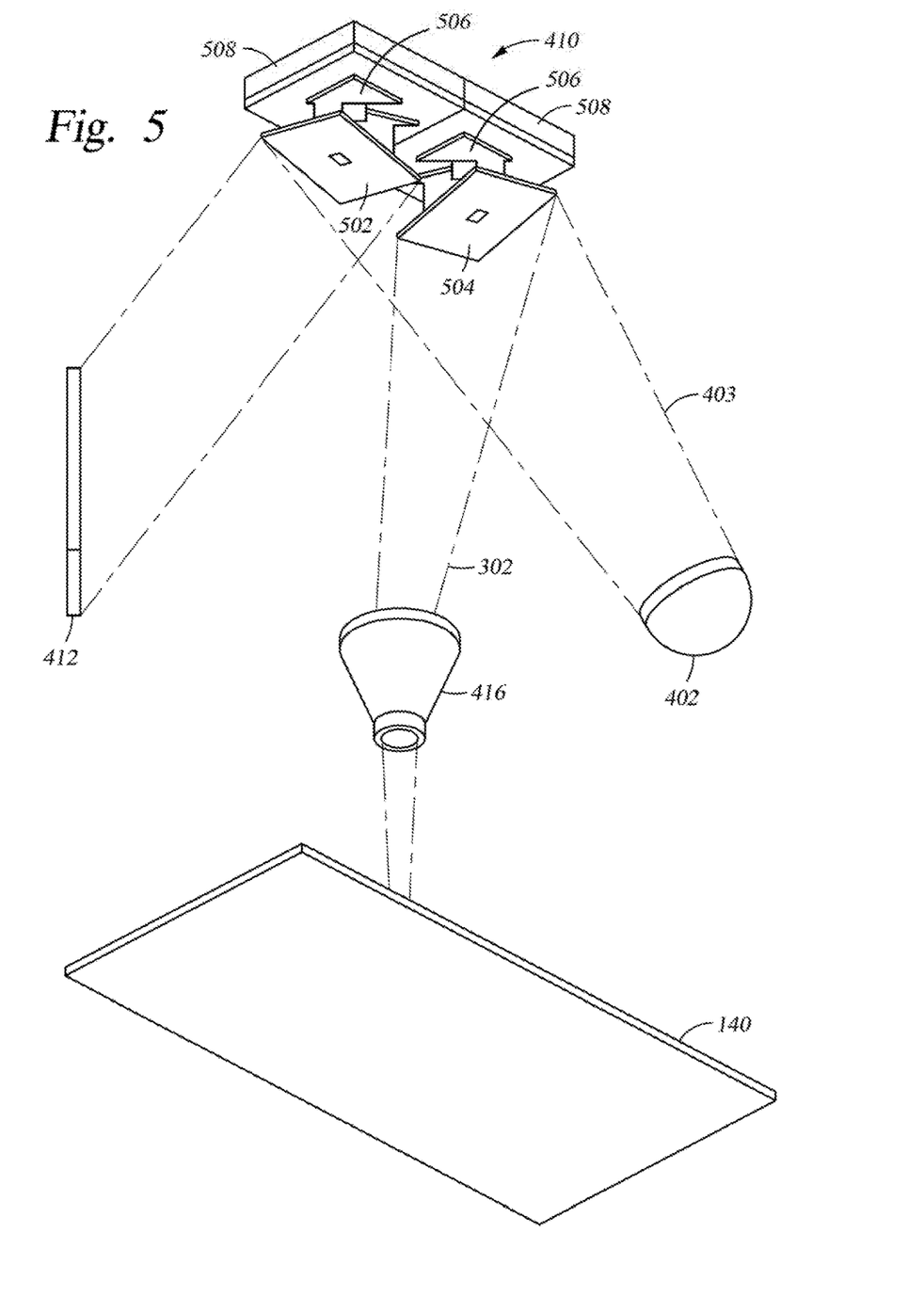
FIG. 5 schematically illustrates a beam being reflected by two mirrors of the DMD according to one embodiment.

FIG. 5 illustrates two mirrors 502, 504 of the DMD 410 according to one embodiment. As shown, each mirror 502, 504 of the DMD 410 is disposed on a tilting mechanism 506, which is disposed on a memory cell 508. The memory cell 508 may be a CMOS SRAM. During operation, each mirror 502, 504 is controlled by loading the mask data into the memory cell. The mask data electrostatically controls the tilting of the mirror 502, 504 in a binary fashion. When the mirror 502, 504 is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree. As shown in FIG. 5, the mirror 502 is at "off" position and the mirror 504 is at "on" position.

The beam 403 may be reflected by the two mirrors 502, 504 of the DMD 410, according to one embodiment. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Figure 6:
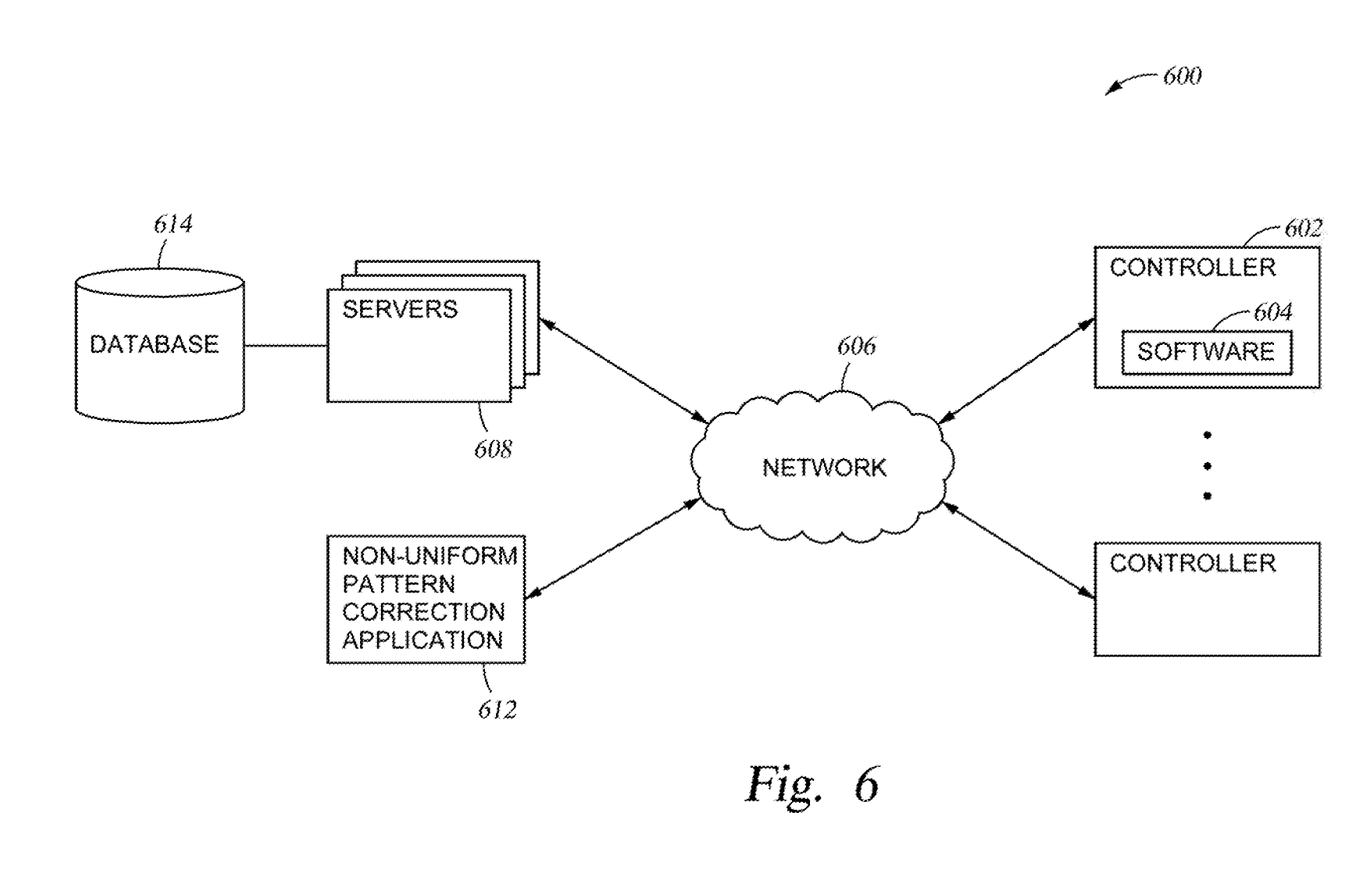
FIG. 6 illustrates a computer system for providing correction of non-uniform image patterns according to one embodiment.

FIG. 6 illustrates a computing system 600 configured for correcting non-uniform image patterns on a substrate in which embodiments of the disclosure may be practiced. As shown, the computing system 600 may include a plurality of servers 608, a non-uniform pattern correction application 612, and a plurality of controllers (i.e., computers, personal computers, mobile/wireless devices) 602 (only two of which are shown for clarity), each connected to a communications network 606 (for example, the Internet). The servers 608 may communicate with the database 614 via a local connection (for example, a Storage Area Network (SAN) or Network Attached Storage (NAS)) or over the Internet. The servers 608 are configured to either directly access data included in the database 614 or to interface with a database manager that is configured to manage data included within the database 614.

Each controller 602 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 608 and the non-uniform pattern correction application 612 may include a processor and a system memory (not shown), and may be configured to manage content stored in database 614 using, for example, relational database software and/or a file system. The servers 608 may be programmed to communicate with one another, the controllers 602, and the non-uniform pattern correction application 612 using a network protocol such as, for example, the TCP/IP protocol. The non-uniform pattern correction application 612 may communicate directly with the controllers 602 through the communications network 606. The controllers 602 are programmed to execute software 604, such as programs and/or other software applications, and access applications managed by servers 608.

In the embodiments described below, users may respectively operate the controllers 602 that may be connected to the servers 608 over the communications network 606. Pages, images, data, documents, and the like may be displayed to a user via the controllers 602. Information and images may be displayed through a display device and/or a graphical user interface in communication with the controller 602.

It is noted that the controller 602 may be a personal computer, laptop mobile computing device, smart phone, video game console, home digital media player, network-connected television, set top box, and/or other computing devices having components suitable for communicating with the communications network 606 and/or the required applications or software. The controller 602 may also execute other software applications configured to receive content and information from the non-uniform pattern correction application 612.

Figure 7:
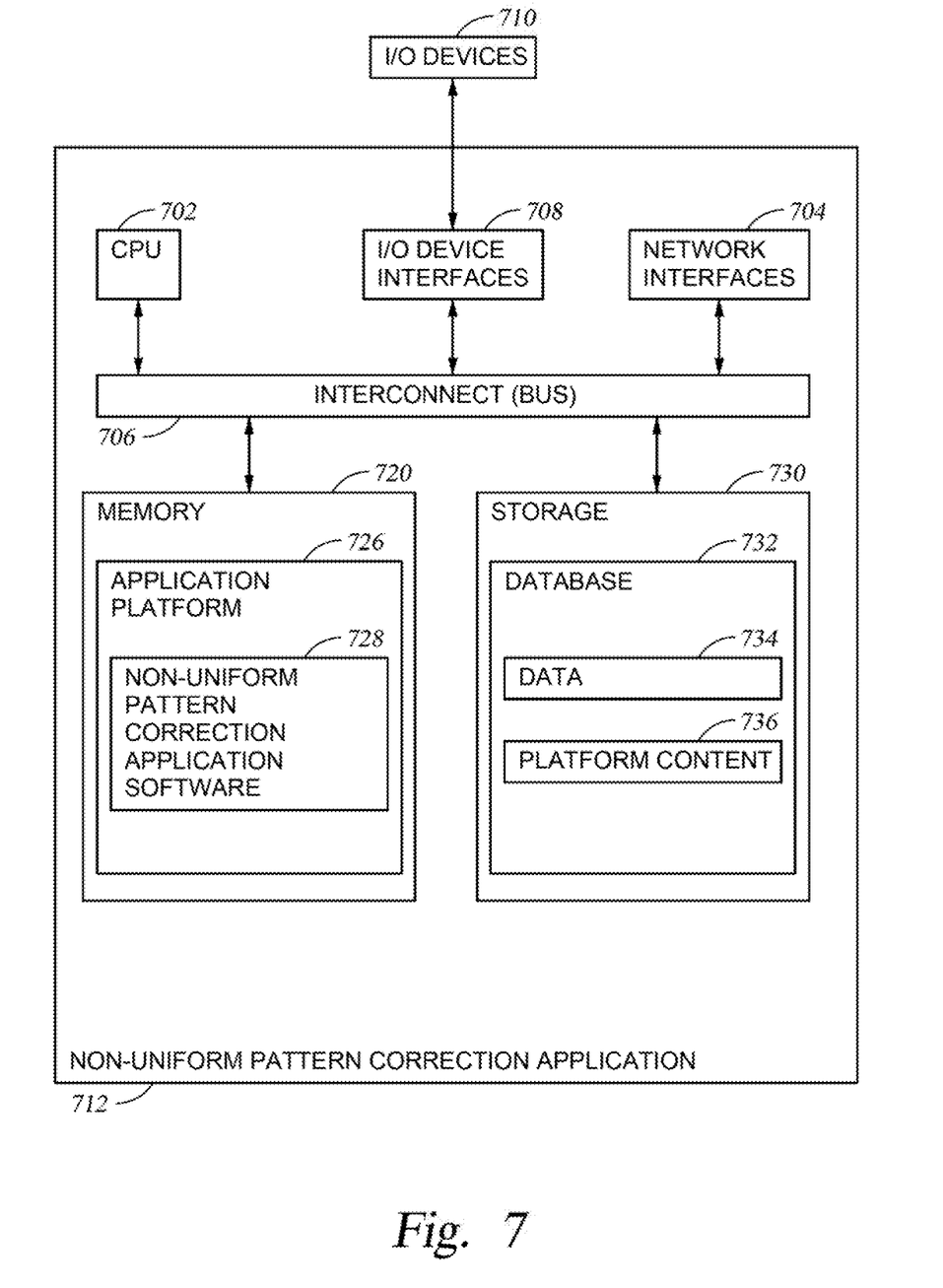
FIG. 7 illustrates a more detailed view of a server of FIG. 6 according to one embodiment.

FIG. 7 illustrates a more detailed view of the non-uniform pattern correction application 612 of FIG. 6. The non-uniform pattern correction application 612 includes, without limitation, a central processing unit (CPU) 702, a network interface 704, memory 720, and storage 730 communicating via an interconnect 706. The non-uniform pattern correction application 612 may also include I/O device interfaces 708 connecting I/O devices 710 (for example, keyboard, video, mouse, audio, touchscreen, etc.). The non-uniform pattern correction application 612 may further include the network interface 804 configured to transmit data via the communications network 606.

The CPU 702 retrieves and executes programming instructions stored in the memory 720 and generally controls and coordinates operations of other system components. Similarly, the CPU 702 stores and retrieves application data residing in the memory 720. The CPU 702 is included to be representative of a single CPU, multiple CPU's, a single CPU having multiple processing cores, and the like. The interconnect 706 is used to transmit programming instructions and application data between the CPU 702, I/O device interfaces 708, storage 730, network interfaces 704, and memory 720.

The memory 720 is generally included to be representative of a random access memory and, in operation, stores software applications and data for use by the CPU 702. Although shown as a single unit, the storage 730 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 720 may store instructions and logic for executing an application platform 726 which may include non-uniform pattern correction application software 728. The storage 730 may include a database 732 configured to store data 734 and associated application platform content 736. The database 732 may be any type of storage device.

Network computers are another type of computer system that can be used in conjunction with the disclosures provided herein. Network computers do not usually include a hard disk or other mass storage, and the executable programs are loaded from a network connection into the memory 720 for execution by the CPU 802. A typical computer system will usually include at least a processor, memory, and an interconnect coupling the memory to the processor.

Figure 8:
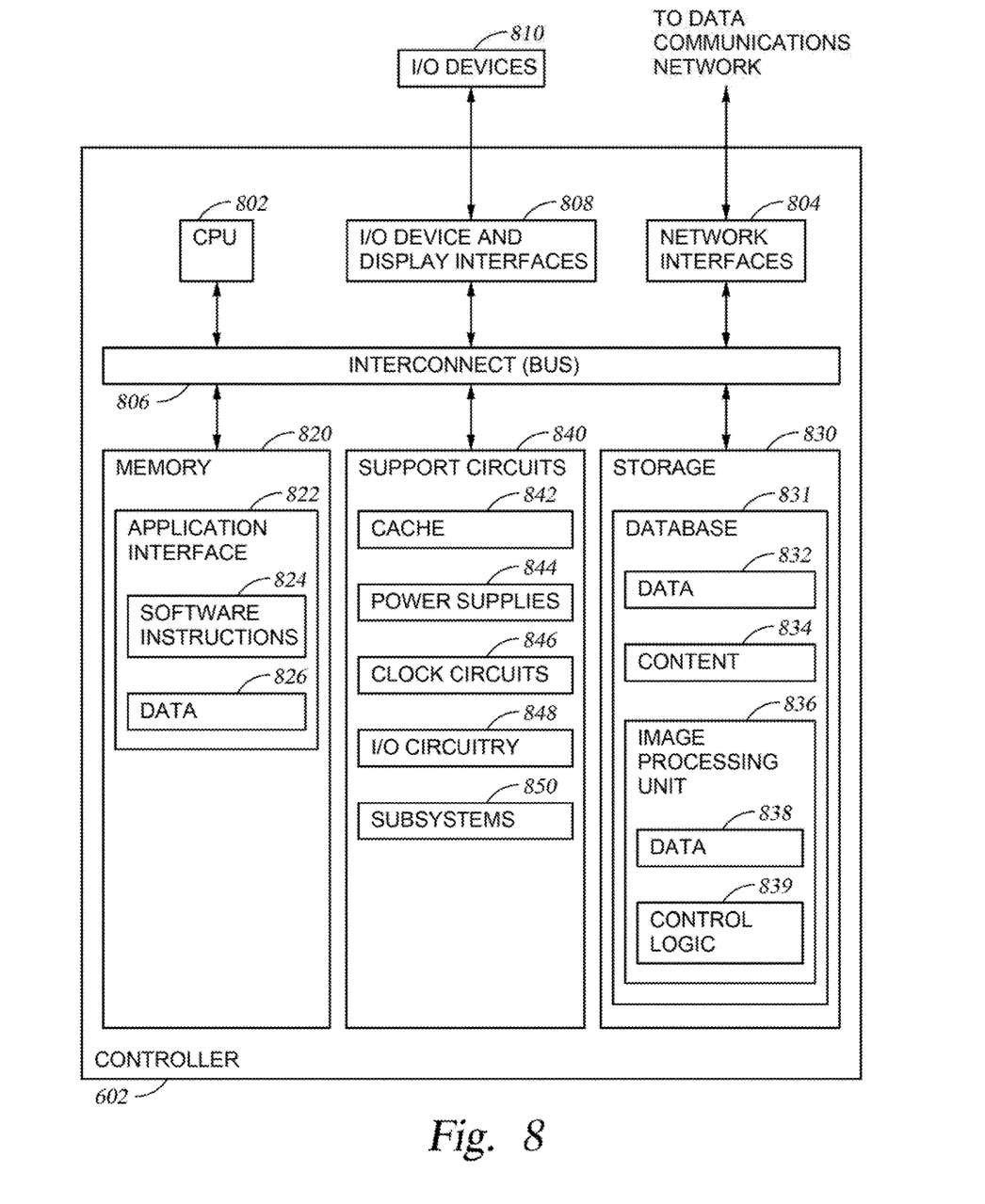
FIG. 8 illustrates a controller computing system used to access a non-uniform pattern correction application according to one embodiment.

FIG. 8 illustrates a controller 602 used to access the non-uniform pattern correction application 612 and retrieve or display data associated with the application platform 726. The controller 602 may include, without limitation, a central processing unit (CPU) 802, a network interface 804, an interconnect 806, a memory 820, storage 830, and support circuits 840. The controller 602 may also include an I/O device interface 808 connecting I/O devices 810 (for example, keyboard, display, touchscreen, and mouse devices) to the controller 602.

Like CPU 702, CPU 802 is included to be representative of a single CPU, multiple CPU's, a single CPU having multiple processing cores, etc., and the memory 820 is generally included to be representative of a random access memory. The interconnect 806 may be used to transmit programming instructions and application data between the CPU 802, I/O device interfaces 808, storage 830, network interface 804, and memory 820. The network interface 804 may be configured to transmit data via the communications network 606, for example, to transfer content from the non-uniform pattern correction application 612. Storage 830, such as a hard disk drive or solid-state storage drive (SSD), may store non-volatile data. The storage 830 may contain a database 831. The database 831 may contain data 832, other content 834, and an image process unit 836 having data 838 and control logic 839. Illustratively, the memory 820 may include an application interface 822, which itself may display software instructions 824, and/or store or display data 826. The application interface 822 may provide one or more software applications which allow the controller to access data and other content hosted by the non-uniform pattern correction application 612.

As shown in FIG. 8, the system 100 includes a controller 602. The controller 602 is generally designed to facilitate the control and automation of the processing techniques described herein. The controller 602 may be coupled to or in communication with one or more of the processing apparatus 160, the stages 130, and the encoder 126. The processing apparatus 160 and the stages 130 may provide information to the controller 602 regarding the substrate processing and the substrate aligning. For example, the processing apparatus 160 may provide information to the controller 602 to alert the controller that substrate processing has been completed. The encoder 126 may provide location information to the controller 602, and the location information is then used to control the stages 130 and the processing apparatus 160.

The controller 602 may include a central processing unit (CPU) 802, memory 820, and support circuits 840 (or I/O 808). The CPU 802 may be one of any form of computer processors that are used in industrial settings for controlling various processes and hardware (e.g., pattern generators, motors, and other hardware) and monitor the processes (e.g., processing time and substrate position). The memory 820, as shown in FIG. 8, is connected to the CPU 802, and may be one or more of a readily available memory, such as random access memory (RAM), read only memory (ROM), floppy disk, hard disk, or any other form of digital storage, local or remote. Software instructions and data can be coded and stored within the memory for instructing the CPU 802. The support circuits 840 are also connected to the CPU 802 for supporting the processor in a conventional manner. The support circuits 840 may include conventional cache 842, power supplies 844, clock circuits 846, input/output circuitry 848, subsystems 850, and the like. A program (or computer instructions) readable by the controller 602 determines which tasks are performable on a substrate. The program may be software readable by the controller 602 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

As described in greater detail within, embodiments of the disclosure relate to an image correction application relating to the ability to apply maskless lithography patterns to a substrate in a manufacturing process is disclosed. The embodiments described herein relate to a software application platform, which corrects non-uniform image patterns on a substrate. The application platform method includes disabling at least one entire column of mirrors in the DMD, wherein the DMD has a plurality of columns each column having a plurality of mirrors, exposing a first portion of the substrate to a first shot of electromagnetic radiation, exposing a second portion of the substrate to a second shot of electromagnetic radiation, and repeating exposing a second portion of the substrate to a second shot of electromagnetic radiation until the substrate is fully processed.

Figure 9:
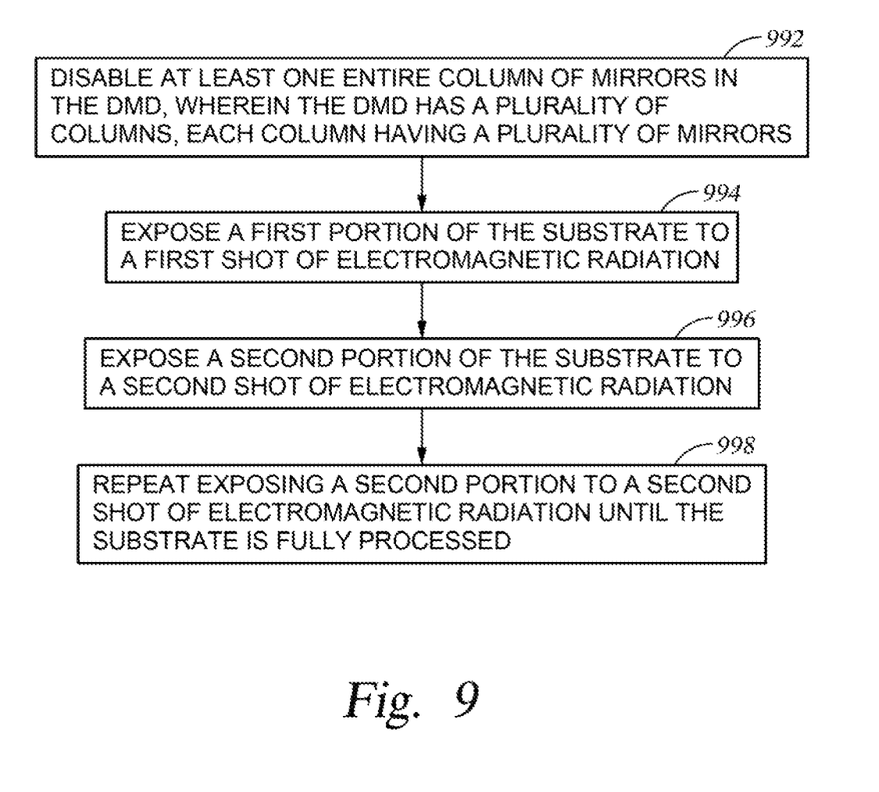
FIG. 9 illustrates a method of correcting non-uniform image patterns on a substrate.

FIG. 9 illustrates a method 990 of correcting non-uniform image patterns on a substrate. The method may be performed by a controller 602, as shown in FIG. 8. The method 990 begins at block 992. At block 992, the controller disables at least one entire column of mirrors in the DMD, wherein the DMD has a plurality of columns, each column having a plurality of mirrors. In one embodiment the controller disables at least one entire column of mirrors in the DMD based on measuring a measured angle of rotation of the DMD. When the DMD is installed in the image projection system, the DMD may be installed at some angle. The angle of installation may result in an interference pattern on the substrate. To reduce the interference pattern on the substrate, at least one entire column of mirrors in the DMD is disabled. In one embodiment, the at least one entire column of mirrors in the DMD is disabled responsive to measuring an angle of rotation of a DMD installed in the image projection system.

Figure 10:
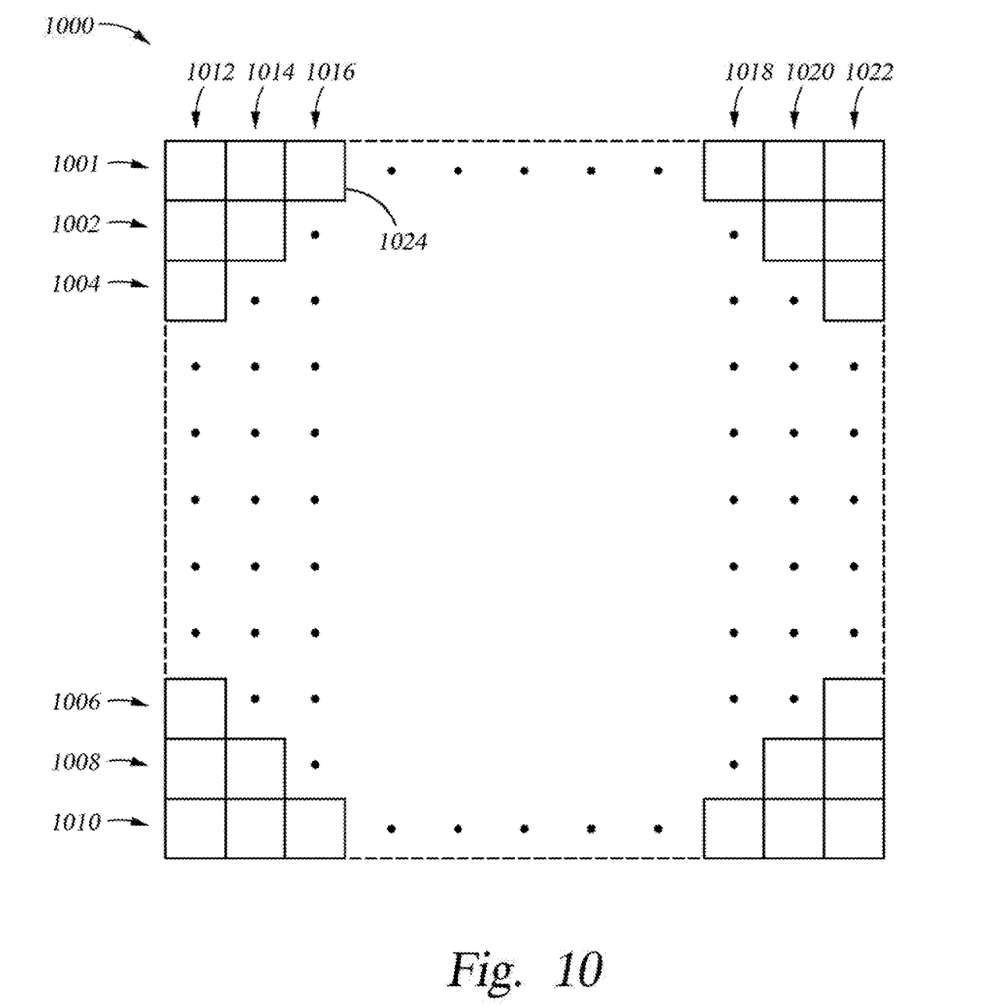
FIG. 10 illustrates a DMD having a plurality of mirrors according to one embodiment.

FIG. 10 illustrates a DMD 1000 having a plurality of mirrors 1024. The plurality of mirrors 1024 are arranged in a grid having M rows and N columns. In FIG. 10, rows 1001, 1002, 1004, 1006, 1008, 1010, and columns 1012, 1014, 1016, 1018, 1020, and 1022 are shown. A controller determines how many columns or rows of mirrors 1024 to disable. In one embodiment, the controller determines how many columns or rows of mirrors 1024 to disable in response to measuring the angle of rotation of the DMD 1000 installed in the image projection system. The controller refers to a table (not shown) in which the user may enter the DMD's 1000 angle of rotation and number or shots desired to output the number of columns or rows that should be disabled. The controller then disables the correct number of columns or rows. For example, in response to a certain angle of rotation, the controller may disable columns 1012 and 1014. For each DMD 410 in the image projection system 301, the controller refers to the table to determine how many columns or rows of mirrors should be disabled in each DMD.

Referring back to FIG. 9, at block 994, a first portion of the substrate is exposed to a first shot of electromagnetic radiation. Exposing the substrate may form a pattern on the substrate to expose a photoresist of the substrate. In one embodiment the image projection system 301 may produce the electromagnetic radiation. The electromagnetic radiation may be visible light, for example, blue laser light emitted from the image projection system 301 and reflected off of the DMD 410. In one embodiment, the image projection system 301 may expose a substrate and deliver light to the surface of the substrate 140. Each exposure may last between approximately about 45 microseconds and about 85 microseconds, for example between about 55 microseconds and about 75 microseconds.

Figure 11:
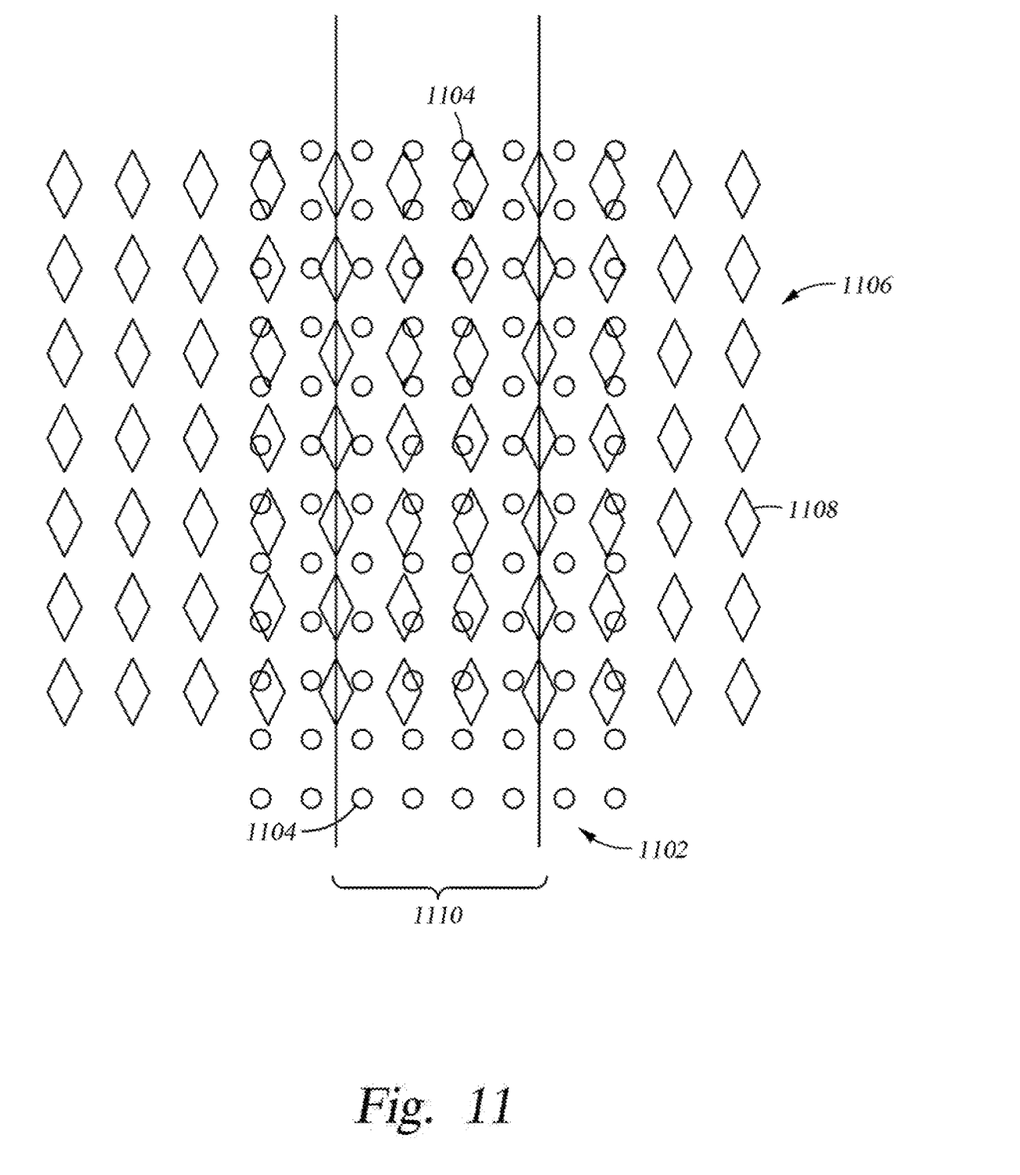
FIG. 11 illustrates areas of the substrate that are exposed to a first shot of electromagnetic radiation.

Referring to FIG. 11, FIG. 11 illustrates areas of the substrate that are exposed to a first shot of electromagnetic radiation. A substrate grid 1102 may be placed atop the substrate. The substrate grid 1102 contains a plurality of equally spaced dots 1104. A DMD centroid grid 1106 is superimposed with the substrate grid 1102. The DMD centroid grid 1106 includes a plurality of equally spaced dots 1108. The substrate steps through the image projection system a predetermined step size. The step size is calculated by dividing the desired number of exposures by the length of the DMD 410. Recall that at least one entire column of mirrors was disabled in block 992. Therefore, the DMD length corresponds to the length of the DMD less the length of any columns that were disabled in block 992. The vertical lines define one or more shapes 1110 that are to be exposed. As the substrate moves through the image projection system one step size at a time, locations at which the dots 1104 of the substrate grid overlap with the dots 1108 of the DMD centroid grid 1106 within the shape 1110 are the locations at which the substrate will be exposed.

Referring back to FIG. 9, at block 996 the substrate is translated a step size and the second portion of the substrate is exposed to a second shot of electromagnetic radiation. Similar to that described in FIG. 11, the substrate will be exposed at locations where the dots 1104 of the substrate grid 1102 overlap with the dots 1108 of the DMD centroid grid 1106 within the shape 1110.

At block 998, the process of translating the substrate a step size and exposing a second portion to a second shot of electromagnetic radiation is repeated until the substrate is fully processed. Each exposure may generate a data set relating to graphical objects patterned on the substrate 140. Each data set may be stored in the memory 920 of the controller. Each data set may be combined to form the image pattern on the substrate 140. Each exposure may form an aerial image of a portion of the substrate 140.

In another embodiment, a computer system for correcting non-uniform image patterns on a substrate is disclosed. The computer system includes a processor and a memory. The memory stores instructions that, when executed by the processor, cause the computer system to correct uniform image patterns on a substrate. The steps include disabling at least one entire column of mirrors in the DMD, wherein the DMD has a plurality of columns each column having a plurality of mirrors, exposing a first portion of the substrate to a first shot of electromagnetic radiation, translating the substrate a step size and exposing a second portion of the substrate to a second shot of electromagnetic radiation, and repeating translating the substrate a step size and exposing a second portion of the substrate to a second shot of electromagnetic radiation until the substrate is fully processed.

In yet another embodiment, a non-transitory computer-readable storage medium, storing instructions that, when executed by the processor, cause the computer system to correct uniform image patterns on a substrate. The steps include disabling at least one entire column of mirrors in the DMD, wherein the DMD has a plurality of columns each column having a plurality of mirrors, exposing a first portion of the substrate to a first shot of electromagnetic radiation, translating the substrate a step size and exposing a second portion of the substrate to a second shot of electromagnetic radiation, and repeating translating the substrate a step size and exposing a second portion of the substrate to a second shot of electromagnetic radiation until the substrate is fully processed.

Benefits of the embodiments disclosed herein may include the correction of line edge roughness ("LER") exposure defects through the use of a software setting. Undesirable line edge roughness may be created due to the misalignment of the substrate on the stage or by vibration of the stage while the substrate is being processed thereon. Selectively disabling columns of mirrors of each DMD in response to the DMD's angle of rotation and number of desired shots may correct line edge roughness exposure defects. Additionally, a DMD 410 may malfunction, causing exposure defects; however the utilization of the non-uniform pattern correction application may fix a malfunction instantaneously via a software setting.

The application described herein maintains the ability to correct non-uniform image patterns by selectively disabling columns of mirrors in a DMD in response to the DMD's angle of rotation and desired number of shots. The application exposes a first portion of the substrate to a first shot of electromagnetic radiation, translates the substrate a step size, exposes a second portion of the substrate to a second shot of electromagnetic radiation.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method for correcting non-uniform image patterns on a substrate, comprising:
    measuring an angle of rotation of a digital micromirror device (DMD) installed in an image projection system, wherein the DMD has a plurality of columns, and each column has a plurality of mirrors;
    disabling at least one entire column of mirrors of the plurality of columns in the DMD in response to the measured angle of rotation to correct line edge roughness to from exposure defects;
    placing a substrate grid comprising a plurality of dots atop the substrate;
    superimposing a DMD centroid grid comprising a plurality of dots with the substrate grid;
    exposing a first portion of the substrate to a first shot of electromagnetic radiation; and
    iteratively translating the substrate a step size and exposing another portion of the substrate to another shot of electromagnetic radiation until the substrate has been completely exposed to shots of electromagnetic radiation.

2. The method of claim 1, wherein disabling at least one entire column of mirrors of the plurality of columns in the DMD comprises:
    searching a table having data regarding the angle of rotation of the DMD and a number of shots desired to determine the number of columns of mirrors in the DMD to disable.

3. The method of claim 1, wherein the step size is determined by dividing a number of shots by a length of the DMD.

4. The method of claim 1, wherein exposing forms a pattern on the substrate to expose a photoresist.

5. The method of claim 1, wherein each exposure generates a data set, wherein each data set is stored in a memory, and wherein each data set is combined to form an aggregate image on the substrate.

6. The method of claim 1, wherein a portion of the substrate in which the plurality of dots of the DMD centroid grid is located above one or more shapes is exposed to the first shot of electromagnetic radiation.

7. The method of claim 1, wherein the first portion of the substrate is exposed to the first shot of electromagnetic radiation for about 45 microseconds to about 85 microseconds.

8. The method of claim 7, wherein the plurality of dots of the substrate grid is a plurality of equally spaced dots, and wherein the plurality of dots of the DMD centroid grid is a plurality of equally spaced dots.

9. A computer system for correcting non-uniform image patterns on a substrate, comprising:
    a processor; and
    a memory storing instructions that, when executed by the processor, causes the computer system to:
        measure an angle of rotation of a digital micromirror device (DMD) installed in an image projection system, wherein the DMD has a plurality of columns, and each column has a plurality of mirrors;
        disable at least one entire column of mirrors of the plurality of columns in the DMD in response to the measured angle of rotation to correct line edge roughness to from exposure defects;
        place a substrate grid comprising a plurality of dots atop the substrate;
        superimpose a DMD centroid grid comprising a plurality of dots with the substrate grid;
        expose a first portion of the substrate to a first shot of electromagnetic radiation; and
        iteratively translate the substrate a step size and exposing another portion of the substrate to another shot of electromagnetic radiation until the substrate has been completely exposed to shots of electromagnetic radiation.

10. The computer system of claim 9, wherein disabling at least one entire column of mirrors of the plurality of columns in the DMD comprises:

searching a table having data regarding the angle of rotation of the DMD and a number of shots desired to determine the number of columns of mirrors in the DMD to disable.

11. The computer system of claim 9, wherein the step size is determined by dividing a number of shots by a length of the DMD.

12. The computer system of claim 9, wherein exposing forms a pattern on the substrate to expose a photoresist.

13. The computer system of claim 9, wherein each exposure generates a data set, wherein each data set is stored in a memory, and wherein each data set is combined to form an aggregate image on the substrate.

14. The computer system of claim 9, wherein exposing is performed by at least one image projection.

15. The computer system of claim 9, wherein the first portion of the substrate is exposed to the first shot of electromagnetic radiation for about 45 microseconds to about 85 microseconds.

16. The computer system of claim 15, wherein the plurality of dots of the substrate grid is a plurality of equally spaced dots, and wherein the plurality of dots of the DMD centroid grid is a plurality of equally spaced dots.

17. A non-transitory computer-readable medium storing instructions that, when executed by a processor, causes a computer system to correct non-uniform image patterns on a substrate, by performing the following:

measuring an angle of rotation of a digital micromirror device (DMD) installed in an image projection system, wherein the DMD has a plurality of columns, and each column has a plurality of mirrors;

disabling at least one entire column of mirrors of the plurality of columns in the DMD in response to the measured angle of rotation to correct line edge roughness to from exposure defects;

placing a substrate grid comprising a plurality of dots atop the substrate;

superimposing a DMD centroid grid comprising a plurality of dots with the substrate grid;

exposing a first portion of the substrate to a first shot of electromagnetic radiation; and iteratively translating the substrate a step size and exposing another portion of the substrate to another shot of electromagnetic radiation until the substrate has been completely exposed to shots of electromagnetic radiation.

18. The non-transitory computer-readable medium of claim 17, wherein disabling at least one entire column of mirrors of the plurality of columns in the DMD comprises:

searching a table having data regarding the angle of rotation of the DMD and a number of shots desired to determine the number of columns of mirrors in the DMD to disable.

19. The non-transitory computer-readable medium of claim 17, wherein the step size is determined by dividing a number of shots by a length of the DMD.

20. The non-transitory computer-readable medium of claim 17, wherein the first portion of the substrate is exposed to the first shot of electromagnetic radiation for about 45 microseconds to about 85 microseconds.

\* \* \* \* \*

UNITED STATES PATENT AND TRADEMARK OFFICE
CERTIFICATE OF CORRECTION

PATENT NO. : 10,495,975 B2  
APPLICATION NO. : 16/389412  
DATED : December 3, 2019  
INVENTOR(S) : Thomas L. Laidig et al.

Page 1 of 1

It is certified that error appears in the above-identified patent and that said Letters Patent is hereby corrected as shown below:

In the Claims

In Column 12, Line 4, in Claim 1, after "roughness" delete "to from".

In Column 12, Line 56, in Claim 9, after "roughness" delete "to from".

In Column 14, Line 6, in Claim 17, after "roughness" delete "to from".

Signed and Sealed this  
Twenty-eighth Day of January, 2020

Andrei Iancu  
*Director of the United States Patent and Trademark Office*